United States Patent
Mazzarella et al.

(10) Patent No.: US 12,506,456 B2
(45) Date of Patent: Dec. 23, 2025

(54) DYNAMIC CAPACITANCE-TO-VOLVAGE OFFSET CANCELLATION

(71) Applicant: InvenSense, Inc., San Jose, CA (US)

(72) Inventors: Federico Mazzarella, Milan (IT); Vadim Tsinker, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 23 days.

(21) Appl. No.: 18/237,533

(22) Filed: Aug. 24, 2023

(65) Prior Publication Data

US 2025/0070735 A1 Feb. 27, 2025

(51) Int. Cl.
*H03F 3/45* (2006.01)
*H03M 1/44* (2006.01)

(52) U.S. Cl.
CPC ..... *H03F 3/45973* (2013.01); *H03F 3/45475* (2013.01); *H03M 1/442* (2013.01); *H03F 2200/261* (2013.01)

(58) Field of Classification Search
CPC ............. H03F 3/45973; H03F 3/45475; H03F 2200/261; H03F 2203/45514; H03M 1/442
See application file for complete search history.

(56) References Cited

U.S. PATENT DOCUMENTS

| | | | |
|---|---|---|---|
| 9,212,910 B2 * | 12/2015 | Donadel | G01C 19/5776 |
| 9,689,889 B1 * | 6/2017 | Casiraghi | G01P 15/125 |
| 9,885,577 B2 | 2/2018 | Tsinker | |
| 10,608,656 B2 | 3/2020 | Tsinker | |
| 11,054,328 B2 * | 7/2021 | Srinivasan | G01L 9/02 |
| 11,320,265 B2 | 5/2022 | Aaltonen et al. | |
| 11,913,788 B2 * | 2/2024 | Tsinker | H03M 1/38 |
| 2002/0178827 A1 * | 12/2002 | Wang | H03M 3/474 |
| | | | 73/718 |
| 2013/0031950 A1 * | 2/2013 | Donadel | G01C 19/5776 |
| | | | 73/1.77 |
| 2016/0341623 A1 * | 11/2016 | Paulitsch | G01M 3/40 |
| 2023/0273025 A1 | 8/2023 | Tsinker et al. | |

* cited by examiner

*Primary Examiner* — Freddie Kirkland, III
(74) *Attorney, Agent, or Firm* — Van Hoven PC; Joshua Van Hoven (57) ABSTRACT

In a microelectromechanical system (MEMS) sensor, movement of a component such as a proof mass due to a force of interest is sensed capacitively. A capacitance-to-voltage (C2V) converter receives a capacitance signal from the sensor and outputs a signal that includes an offset in addition to a signal of interest. The output signal is analyzed to identify the offset portion of the output signal and to modify values one or more variable capacitors coupled to the C2V input reduce the offset portion of the output signal.

35 Claims, 8 Drawing Sheets

DYNAMIC CAPACITANCE-TO-VOLVAGE OFFSET CANCELLATION

BACKGROUND

Numerous items such as smart phones, smart watches, tablets, automobiles, aerial drones, appliances, aircraft, exercise aids, and game controllers may utilize sensors such as microelectromechanical system (MEMS) sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

As MEMS sensors are integrated into an increasing number and type of devices having a variety of applications and form factors, there are numerous constraints on MEMS sensor design and to design of systems including multiple MEMS sensors. In some applications, multiple MEMS sensors (e.g., corresponding to multiple measurement axes) may share certain processing components, such as portions of a sense path and analog and digital processing circuitry. There may be substantial constraints on the physical size and/or power consumption of components that may be utilized with MEMS sensors.

SUMMARY

In an embodiment of the present disclosure, a MEMS sensor comprises a MEMS structure including one or more MEMS components that move in response to a force of interest, wherein the movement causes a change of a sense capacitance of the MEMS sensor, a capacitance-to-voltage (C2V) converter configured to receive a capacitance signal that corresponds to the sense capacitance, and a sense path coupled to the MEMS structure and the C2V converter to provide the capacitance signal to the C2V converter. The MEMS sensor may also include one or more variable capacitors coupled to the sense path and processing circuitry coupled to an output of the C2V converter and the one or more variable capacitors, wherein the processing circuitry is configured to receive an output signal from the output of the C2V converter, identify an offset signal portion of the output signal, and generate a variable capacitor control signal to modify a capacitance of the one or more variable capacitors to remove the offset signal portion from the output signal.

In an embodiment of the present disclosure, a method for removing offset from an output of a MEMS C2V converter comprises receiving, at an input of the C2V converter, a capacitance signal that corresponds to a movement of a component of a microelectromechanical system (MEMS) structure due to a force of interest and outputting, from the C2V converter, an output signal, wherein the output signal includes an offset signal portion of the output signal. The method further comprises generating, by processing circuitry, a variable capacitor control signal to remove the offset signal portion from the output signal and providing, from the processing circuitry to one or more variable capacitors, the variable capacitor control signal, wherein the one or more variable capacitors are coupled to the C2V converter to modify the received capacitance signal.

In an embodiment of the present disclosure, a method for removing a sampled offset from a sensed signal of a microelectromechanical system (MEMS) gyroscope comprises receiving, at an input of a C2V converter, a capacitance signal that corresponds to a movement of a component of a MEMS structure and outputting, from the C2V converter, an output signal. The method further comprises integrating the output signal and digitizing the integrated output signal, wherein the integrated and digitized output signal corresponds to an offset portion of the output signal. The method further comprises generating, by digital processing circuitry, a variable capacitor control signal to remove the offset portion of the output signal and providing, from the digital processing circuitry to one or more variable capacitors, the variable capacitor control signal, wherein the one or more variable capacitors are coupled to the C2V converter to modify the received capacitance signal.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION

A MEMS sensor such as a MEMS gyroscope outputs a capacitance signal that corresponds to the movement of movable MEMS components such as proof masses in response to a force of interest, such as an angular velocity about a particular axis. The received capacitance signal includes a variety of signal components based on the operation of the MEMS, such as the force of interest that is being measured (e.g., angular velocity), a periodic signal that corresponds to the drive frequency of the MEM gyroscope, and a quadrature signal. The sense path that receives the capacitive signal includes a variety of components such as a C2V converter that provides amplification of the received capacitance signal and additional components such as feedback capacitors for the C2V converter and capacitors and other components used for compensation of undesired signal components.

In some applications, multiple MEMS sensors may output capacitance signals to a common sense path in a "round-robin" fashion (e.g., via a multiplexer switching capacitive output signals at a switching frequency), allowing a single sense path to selectively provide processing for multiple MEMS sensor capacitive signals. In some instances, components such as reset switches (e.g., connected in parallel with the C2V converter) perform a function of resetting or otherwise removing a contribution of a previously processed capacitive signal from a capacitive signal that is currently being processed (e.g., with the reset occurring at the switching frequency). In some implementations, this reset may occur when the periodic portion of the capacitance signal associated with the force of interest (e.g., the Coriolis signal) is at or near zero. After a transition from one capacitance signal to the next (e.g., from processing one gyroscope axis output to the next gyroscope axis output), the C2V may nonetheless be sampling the unwanted quadrature signal, which is 90 degrees out of phase with the Coriolis signal.

However the C2V signal is supplied and generated, this signal often includes an "offset" signal portion, for example, due to unwanted signal components and sampling during round-robin switching. The result is that this offset signal portion can occupy a large portion of the C2V output range (e.g., up to a third in some implementations), forcing C2V gain reduction in order to prevent C2V amplifier saturation. This, in turn, causes amplification of ADC noise by a third reducing gyroscope system noise performance.

Additional circuitry and processing may be implemented to substantially reduce or eliminate the offset portion of the C2V output signal. The output of the C2V converter is processed and analyzed to identify and determine characteristics of the offset portion of the C2V output. A feedback look is implemented wherein a control signal is provided to control circuitry coupled to the C2V output in a manner that reduces or eliminates that offset signal portion of the C2V output. In this manner, the feedback loop is continuously operating to dynamically drive and maintain the offset signal portion of the C2V output towards zero. Without the offset signal portion occupying the dynamic range of the C2V, the C2V gain can be better allocated to the signal of interest (e.g., Coriolis signal), resulting in a larger C2V amplifier gain. A larger amplifier gain suppresses analog-to-digital converter (ADC) noise in the signal processing path of the C2V output, resulting in an overall lower noise system.

In an example implementation, the C2V output signal may be coupled to an analog stage including an integrator and an ADC, with the integrator processing the output over time to output an averaged signal that changes with the offset signal portion, and the ADC converting the output of the integrator into a digital signal that can be processed by a digital stage that modulates the control signal. An example digital stage applies sigma-delta modulation to modulate the control signal in a manner to drive the offset signal portion towards zero. In an example, the control signal controls a capacitive digital-to-analog (DAC) converter, which may be implemented as variable capacitors that are coupled to the sense path between the MEMS sensor capacitive output and the C2V input. In this manner, the system employs a capacitive DAC modulated by a digitally controlled loop (e.g., a sigma-delta modulator) in order to cancel offset dynamically.

Figure 1:
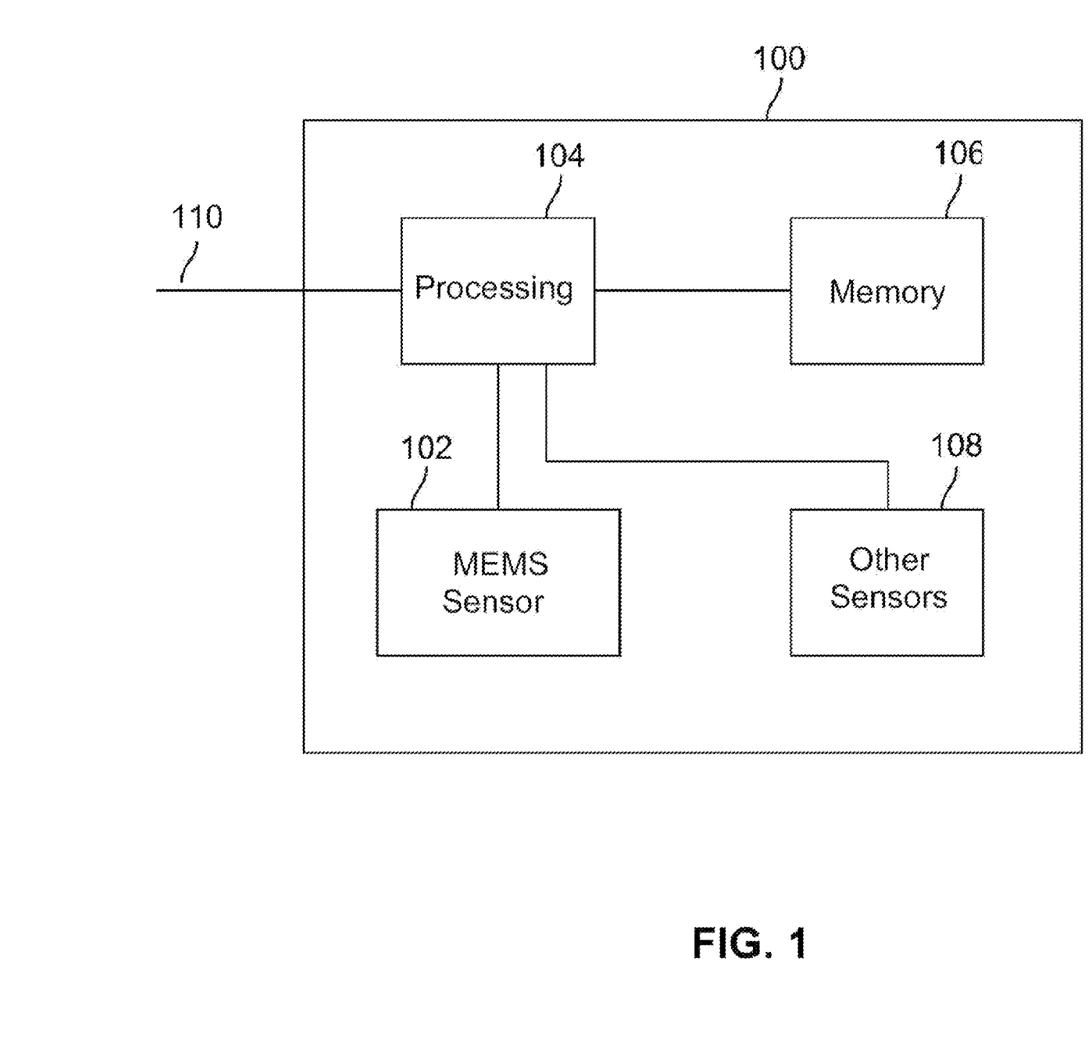
FIG. 1 shows an illustrative MEMS system in accordance with an embodiment of the present disclosure.

FIG. 1 shows an illustrative MEMS system 100 in accordance with an embodiment of the present disclosure. Although particular components are depicted in FIG. 1, it will be understood that other suitable combinations of the MEMS, processing components, memory, and other circuitry may be utilized as necessary for different applications and systems. In accordance with the present disclosure, the MEMS system may include a MEMS gyroscope 102 as well as additional sensors 108. Although the present disclosure will be described in the context of capacitive signals received from MEMS gyroscopes, it will be understood that the offset cancellation circuitry and processing described in the present disclosure may be utilized with other capacitive MEMS sensors or gyroscope sensing methodologies.

Processing circuitry 104 may include one or more components providing processing based on the requirements of the MEMS system 100. In some embodiments, processing circuitry 104 may include hardware control logic that may be integrated within a chip of a sensor (e.g., on a base substrate of a MEMS gyroscope 102 or other sensors 108, or on an adjacent portion of a chip to the MEMS gyroscope 102 or other sensors 108) to control the operation of the MEMS gyroscope 102 or other sensors 108 and perform aspects of processing for the MEMS gyroscope 102 or the other sensors 108. In some embodiments, the MEMS gyroscope 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS gyroscope 102 by interacting with the hardware control logic and processing signals received from MEMS gyroscope 102. The microprocessor may interact with other sensors 108 in a similar manner. In some embodiments, some or all of the functions of the processing circuitry 104, and in some embodiments, of memory 106, may be implemented on an application specific integrated circuit ("ASIC") and/or a field programmable gate array ("FPGA").

Although in some embodiments (not depicted in FIG. 1), the MEMS gyroscope 102 or other sensors 108 may communicate directly with external circuitry (e.g., via a serial bus or direct connection to sensor outputs and control inputs), in an embodiment the processing circuitry 104 may process data received from the MEMS gyroscope 102 and other sensors 108 and communicate with external components via a communication interface 110 (e.g., a serial peripheral interface (SPI) or I2C bus, in automotive applications a controller area network (CAN) or Local Interconnect Network (LIN) bus, or in other applications a suitably wired or wireless communications interface as is known in the art). The processing circuitry 104 may convert signals received from the MEMS gyroscope 102 and other sensors 108 into appropriate measurement units (e.g., based on settings provided by other computing units communicating over the communication interface 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS gyroscope 102 or other sensors 108.

In some embodiments, certain types of information may be determined based on data from multiple MEMS gyroscopes 102 and other sensors 108 in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In embodiments of the present disclosure, the MEMS sensor such as a MEMS gyroscope includes components that respond to a force of interest such as an angular velocity about an axis of interest by moving in a manner that changes a capacitance between adjacent components. Although differential sensing is not required in the context of the present disclosure, the MEMS components may be configured such that differential outputs are generated in response to the force of interest, for example, based on respective capacitors of a MEMS sensor changing in capacitance in an equal and opposite manner. The capacitance signal outputs from the MEMS sensor are provided to an amplifier such as a C2V converter, which in the context of round-robin sensing (e.g., multiple sensor outputs being output to common processing circuitry over time) may be reset such as when the capacitance signal outputs are changed to a new MEMS sensor output or periodically during measurement of a MEMS sensor output (e.g., at a full period of the Coriolis signal) The output of the C2V is provided to offset processing circuitry, which analyzes an offset portion of the C2V output signal, which in turn corresponds to an undesired (e.g., non-information carrying) portion of the C2V output, and is an artifact of the MEMS sensor configuration (e.g., including quadrature signals and carrier signals) and other processing such as timing of C2V resets.

The offset processing circuitry includes components such as in integrator, an ADC (e.g., a successive-approximation-register or "SAR" ADC) and digital processing (e.g., a sigma-delta modulator). The integrator integrates (e.g., averages) the output of the C2V converter over time, resulting in an output that approximates the offset. The ADC digitizes the output of the integrator and provides the digitized integrator output to the digital processing. The digital processing (e.g., sigma-delta modulator) evaluates the digitized integrator output, which is representative of the offset portion of the signal that is output by the C2V, and generates control signals for digitally controlled variable capacitors (e.g., a selectable capacitor bank) connected at the input to the C2V. These control signals modify the variable capacitors in a manner that reduces the offset that is output by the C2V, while not modifying the underlying sensor output signal (e.g., a sensed signal such as a Coriolis signal output from a gyroscope, modulated by a drive/carrier frequency). The digital processing continues to dynamically modify the values of the variable capacitors to maintain the offset at a negligible value. This allows the gain of the C2V to be allocated to the underlying sensed (e.g., Coriolis) signal.

Figure 2:
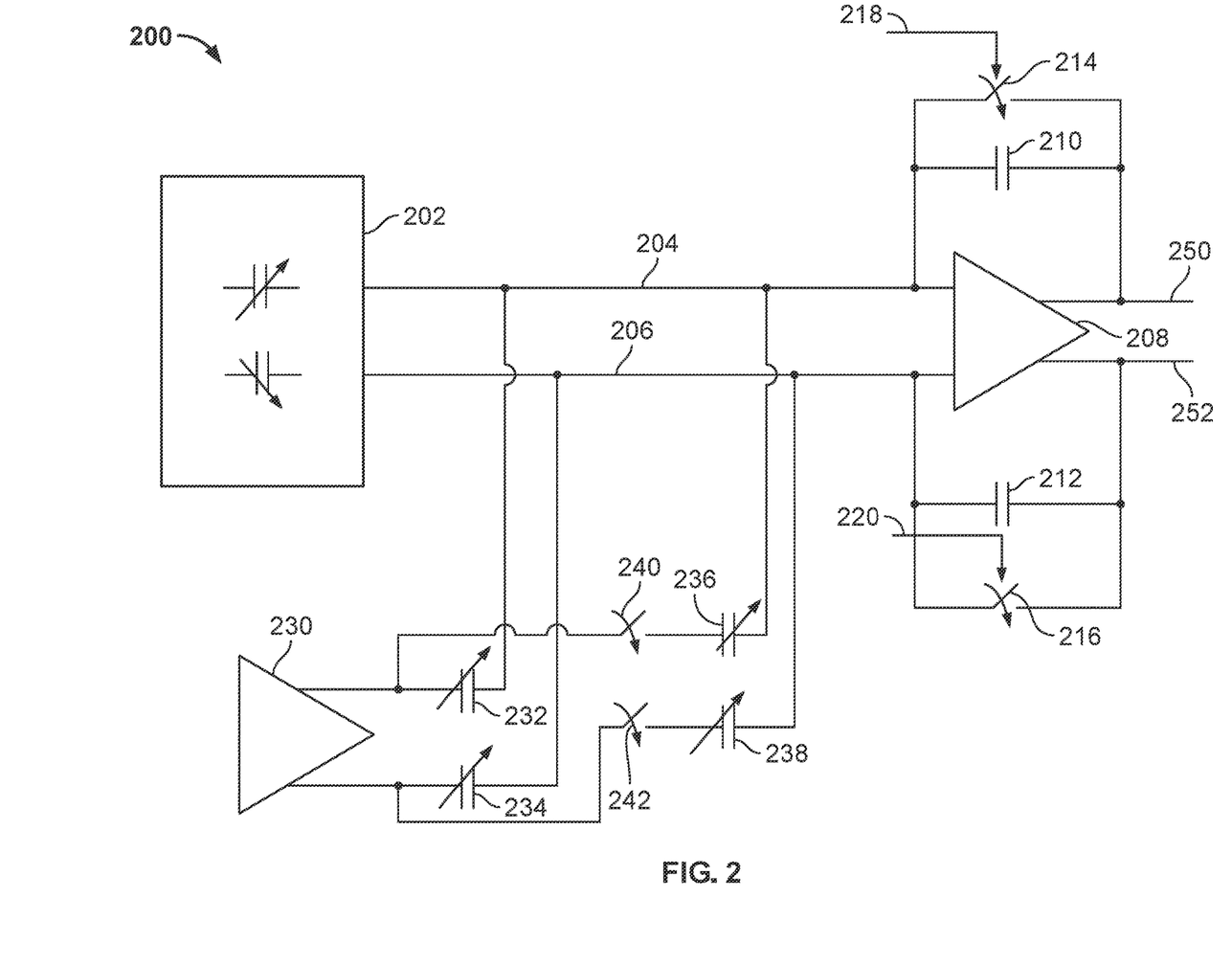
FIG. 2 depicts a circuit diagram of exemplary MEMS sensor in accordance with an embodiment of the present disclosure.

FIG. 2 depicts a circuit diagram of exemplary MEMS sensor in accordance with an embodiment of the present disclosure. Although FIG. 2 will be described in the context of a particular application and system components, it will be understood that the present disclosure may be utilized with a variety of systems and sensors, such as different types of MEMS sensor or capacitive sensing devices. Although particular components are depicted and described in FIG. 2, it will be understood that components may be added, removed, substituted, or modified in accordance with the present disclosure. In the example depicted in FIG. 2, a MEMS sensor includes a MEMS structure 202, a sense path including first sense path signal line 204 and second sense path signal line 206, a C2V amplifier 208, feedback capacitors 210 and 212, reset switches 214 and 216, reset control lines 218 and 216, first C2V output 250, second C2V output 252, drive circuitry 230, first (feed through or "FT") capacitor 232, second FT capacitor 234, first (sampled offset correction or "SOC") capacitor 236, second SOC capacitor 238, first SOC switch 240, and second SOC switch 242.

In an exemplary embodiment where the MEMS sensor 200 is a MEMS gyroscope, the gyroscope sense path typically consists of a C2V amplifier 208 and an analog-to-digital converter ("ADC"-not depicted in FIG. 2) that follows it. The C2V amplifier 208 is a capacitance sensing circuit, that converts the rotation-related charge stored on MEMS capacitors formed by MEMS structure 202 to an output voltage by pushing this charge from MEMS capacitors (not depicted) to feedback capacitors (e.g., feedback capacitors 210 and 212) of the C2V amplifier 208. The C2V amplifier 208 output common mode 250/252 is set by an output common mode amplifier (not depicted), while the input common mode may be set either by a very large feedback resistor (e.g., a Gigaohm FET, not depicted) or a periodic reset signal (e.g., 218 and 220) that shorts the output of the C2V to its input (e.g., via switches 214 and 216).

In some instances, the signals output to the sense path (e.g., first sense path signal line 204 and second sense path signal line 206) may be provided in a round robin fashion from multiple MEMS structures 202, for example, by time multiplexing (not depicted in FIG. 2) the outputs of multiple MEMS structures 202. An example of round robin sensing is described in U.S. patent application Ser. No. 17/680,637, filed on Feb. 25, 2022, and entitled "Round Robin Sensor Device for Processing Sensor Data," which is incorporated by reference herein in its entirety. With round robin operations only a reset method of applying output common mode to input is feasible due to the short time that the reset signal (e.g., 218 and 220) is present. The timing of the reset signal 218/220 is typically aligned with the zero crossing of the Coriolis signal sinusoid that is output by the MEM structure 202.

When the reset switch is opened, the sampled MEMS Coriolis signal (e.g., including a signal at a drive frequency of the system, with a signal due to angular velocity modifying the amplitude of the Coriolis signal) provided as an input to C2V amplifier 208 via the sense path (first sense path signal line 204 and second sense path signal line 206) is transferred to C2V feedback capacitors 210 and 212 and shows up as a sampled offset at C2V output 250/252. Since the MEMS Coriolis signal is nearly zero at that time, very little of the MEMS signal gets sampled during the release of the reset signal and very little of C2V output range is occupied by such offset.

Other signals such as quadrature and harmonics are present with the Coriolis within the sense path signal lines 204/206. As it is 90 degrees out of phase with the Coriolis signal and the reset occurs at a zero-crossing of the Coriolis signal, a quadrature signal sampled at the opening of the reset switches is at its maximum. In some embodiments, the C2V amplifier sampled offset due to quadrature is partially cancelled via statically trimmed SOC capacitors (e.g., SOC capacitors 236 and 238), which are selectively placed in parallel with FT capacitors 232 and 234 between drive circuitry 230 (e.g., applying a DC voltage) and the sense path signal lines 202/204. The trimming of the SOC capacitors may be performed such as during manufacturing, e.g., in a manner that attempts to match and partially remove a contribution of the unwanted quadrature signal from the C2V amplifier 208 output. However, this trimming is limited in precision and only occurs at one point in time, whereas moderate wear, temperature, stresses applied during assembly with other components, and the like may occur after the MEMS sensor manufacturing, such that the original trimming no longer matches the actual quadrature signal output, resulting in the appearance of an undesired offset at the output of C2V amplifier 208. This offset, in turn, limits the gain applied to the signal of interest such as a Coriolis signal, since the offset occupies a significant portion of the C2V amplifier 208 output.

Figure 3:
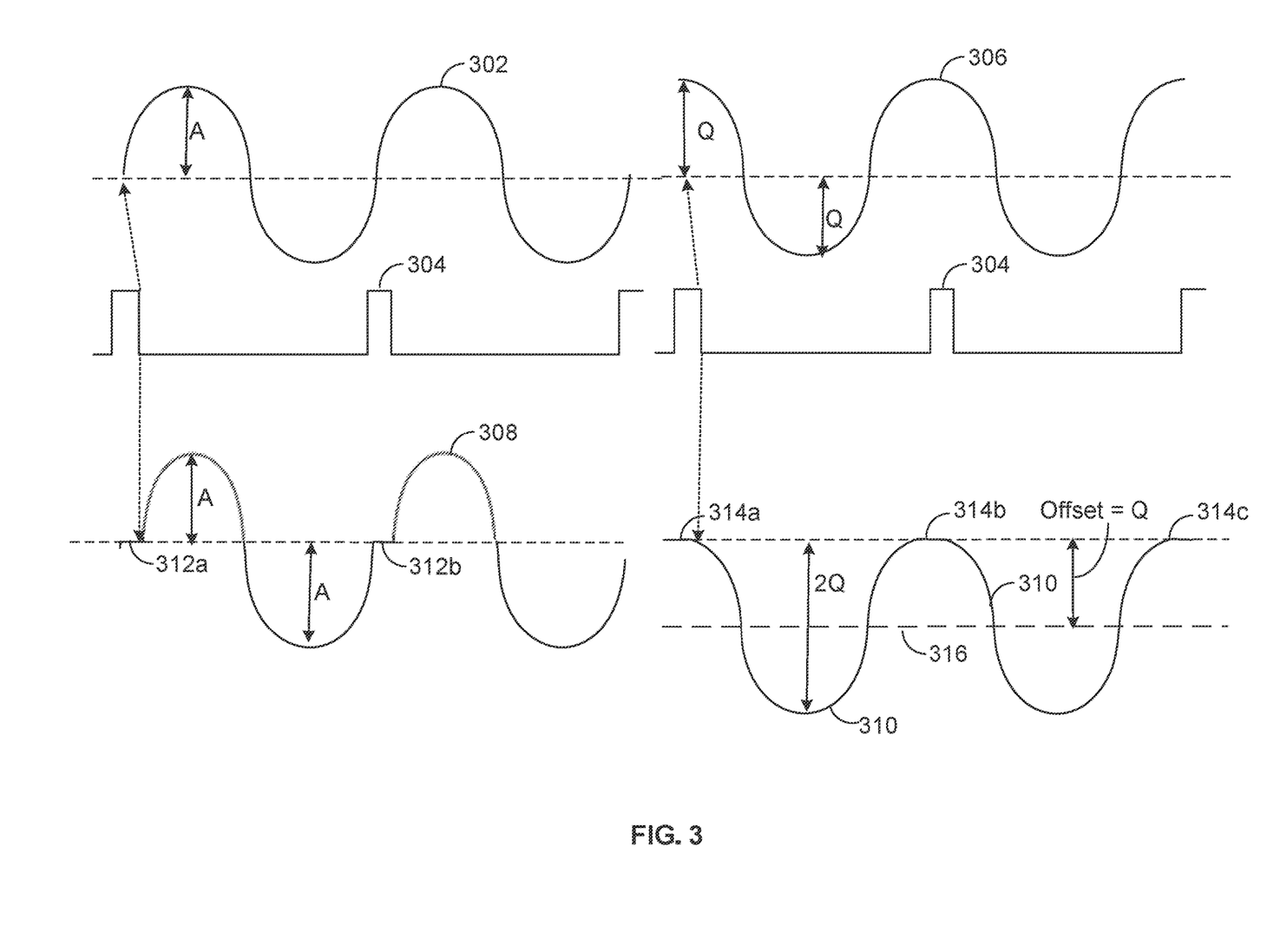
FIG. 3 depicts exemplary signal plots of capacitance-to-voltage (C2V) converter input, reset, and output signals for a MEMS sensor in accordance with an embodiment of the present disclosure.

FIG. 3 depicts exemplary signal plots of capacitance-to-voltage (C2V) converter input, reset, and output signals for MEMS sensor in accordance with an embodiment of the present disclosure. Although particular plots for particular types of signals are depicted in FIG. 3, it will be understood that other signal sources (e.g., instead of or in addition to Coriolis signal 302, uncancelled quadrature signal 306), control signals (e.g., instead of or in addition to reset signal 304) and output signals (e.g., instead of or in addition to Coriolis output signal 308 and quadrature output signal 310, having different characteristics based on different C2V amplifier configurations or different sense circuitry) may exhibit similar offset characteristics that may be processed and compensated in accordance with the present disclosure. In the embodiment of FIG. 3, a Coriolis signal 302, reset signal 304, quadrature signal 306, and Coriolis output signal 308, and quadrature output signal 310 are described and depicted on a common timescale.

A Coriolis signal 302 may have a frequency in accordance with a drive frequency of a MEMS gyroscope and may include amplitude changes based on an angular velocity that causes a Coriolis force to occur, such as to a proof mass of the MEMS gyroscope that forms capacitors with an adjacent sense electrode. An output of a MEMS gyroscope may also include a quadrature signal 306 at the drive frequency of the MEMS system but 90 degrees out of phase with Coriolis signal 302. Although the Coriolis signal 302 and quadrature signal 306 are provided as a single combined output from the MEMS sensor to the C2V amplifier, the signal portions are depicted separately in FIG. 3 for ease of illustration, in order to depict the effect of a reset timing on an output offset value. As described with respect to FIG. 2, even when cancellation is performed on the quadrature signal, a significant quadrature signal may remain. In some instances, no quadrature cancellation may be performed and the entirety of the quadrature output of the MEMS gyroscope may be represented as quadrature signal 306.

As depicted in FIG. 3, a reset pulse is aligned with certain zero-crossings of the Coriolis signal 302, for example, based on the known frequency and phase of a provided drive signal to drive the MEMS gyroscope. As described herein, a reset signal 304 temporarily resets the sense circuitry such as by temporarily creating a short between the input and output of a C2V amplifier. As depicted at Coriolis output signal 308, during this time that the reset signal 304 is active the amplitude of the Coriolis output signal 308 is zero (e.g., at reset output portions 312a and 312b). After the reset signal becomes inactive, the contributions of the Coriolis signal 302 to the Coriolis output signal 308 starts from zero at the time of the release of the reset such that the Coriolis output signal 308 is a periodic signal that generally aligns to the Coriolis signal 302 with an amplitude A until the next reset, resulting in an average value (e.g., DC offset value) for the Coriolis output signal 308 that approximates zero.

Because the quadrature signal 306 is 90 degrees out of phase with the Coriolis signal 302, the reset occurs at a non-zero point of the quadrature signal near the signal maximum or minimum peak (e.g., depending on which zero-crossing of the Coriolis signal corresponds to the reset signal). After an initial zero output 314a of the quadrature output signal 310 during the initial reset (and after later resets 314b and 314c) the quadrature signal decreases from the zero output signal level, resulting in an oscillation about a signal level of −Q (e.g., with Q being the quadrature signal amplitude) below the zero signal level. This results in a DC offset of Q corresponding to the quadrature output signal 310, which in turn has an amplitude Q based on the uncancelled quadrature signal received at the C2V amplifier input. Because this offset signal is seen at the output of the C2V amplifier even in the absence of a Coriolis force, a significant portion of the C2V range is consumed by this offset, resulting in saturation if scaling for the Coriolis output is increased significantly.

Figure 4:
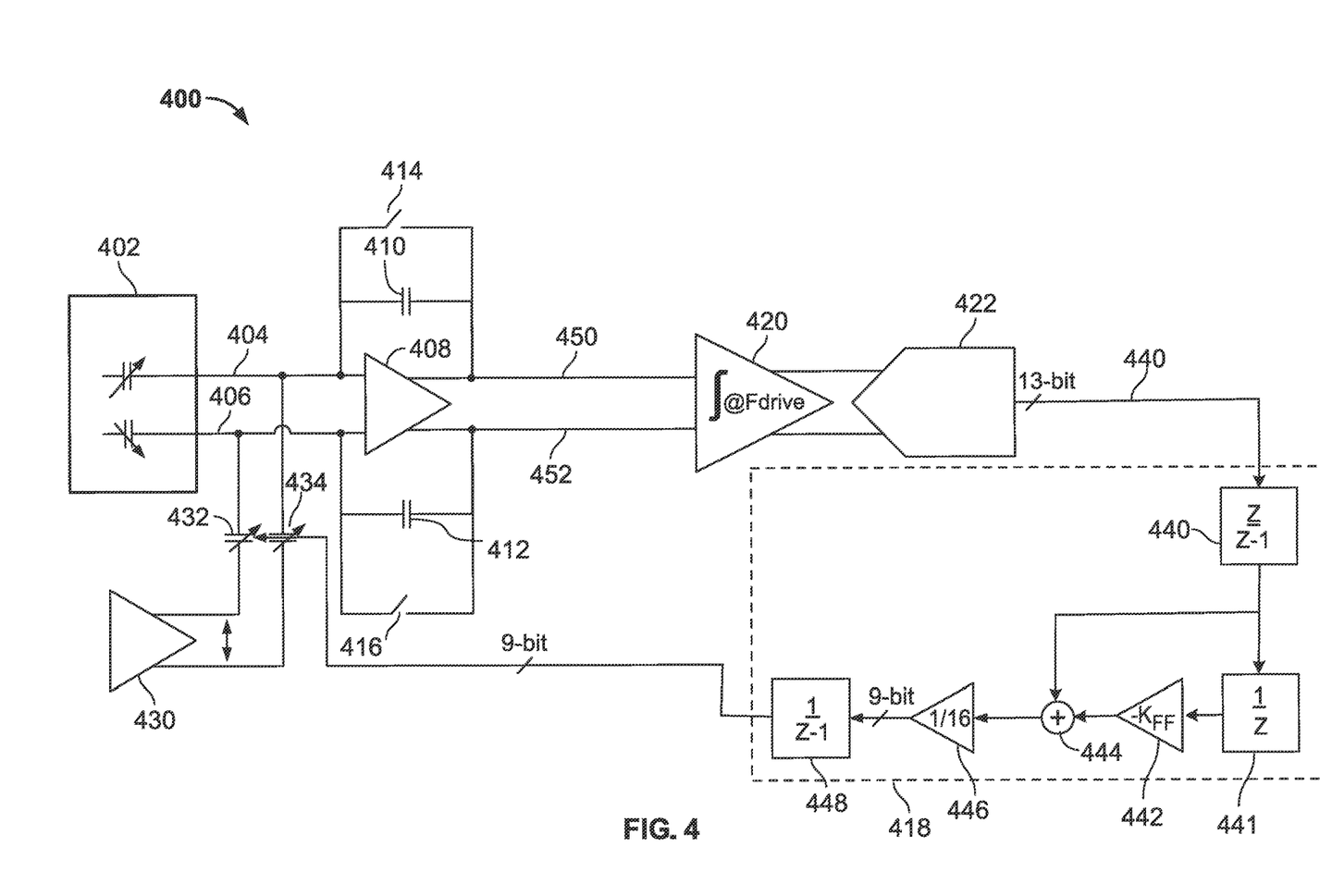
FIG. 4 depicts a circuit diagram of an exemplary MEMS sensor including offset cancellation in accordance with an embodiment of the present disclosure.

FIG. 4 depicts a circuit diagram of an exemplary MEMS sensor including offset cancellation in accordance with an embodiment of the present disclosure. Although FIG. 4 will be described in the context of a particular application and system components, it will be understood that the present disclosure may be utilized with a variety of sensors, systems, or applications where offset cancellation is required. Although particular components are depicted and described in FIG. 4, it will be understood that components may be added, removed, substituted, or modified in accordance with the present disclosure. In the example depicted in FIG. 4, a MEMS sensor 400 includes a MEMS structure 402 and processing circuitry, the processing circuitry including first sense path signal line 404 and second sense path signal line 406, a C2V amplifier 408, feedback capacitors 410 and 412, reset switches 414 and 416 (reset control lines are not depicted in FIG. 4), first C2V output 450, second C2V output 452, drive circuitry 430, variable capacitor 432, variable capacitor 434, integrator 420, ADC 422 (e.g., a 13-bit SAR ADC), and digital stage 418. Although the digital stage may be implemented in a variety of manners including sigma-delta and non-sigma delta methodologies, in an embodiment the digital stage 418 may comprise a second-order sigma-delta modulator. Although a second-order delta-sigma modulator may be implemented in a variety of manners, in an embodiment the sigma-delta modulator may include first filter 440, second filter 441, first gain element 442, adder 444, second gain element 446, and third filter 448.

In an exemplary embodiment where the MEMS sensor 400 is a MEMS gyroscope, the gyroscope sense path typically consists of a C2V amplifier 408 and an analog-to-digital converter (e.g., a second ADC connected to the C2V amplifier 408 output, not depicted in FIG. 4) that follows it. As described herein, offset cancellation circuitry such as the circuitry depicted in FIG. 4 (e.g., including an analog stage including integrator 420 and ADC 422, a digital stage 418, variable capacitors 432 and 434, and drive circuitry 430) dynamically removes the offset portion from the C2V amplifier 408 output (e.g., the signal seen at C2V outputs 450 and 452). More gain can therefore be applied at C2V amplifier 408, providing additional amplification of a Coriolis signal that is provided (e.g., via signal paths from C2V outputs 450 and 452) to another ADC (e.g., another SAR ADC without an integrator connected between the C2V amplifier 208 and SAR ADC) such that the ADC has additional bits (e.g., corresponding to better resolution) available to process and digitize the Coriolis signal. In another embodiment, the separate Coriolis ADC can consist of a separate integrator, but the SAR 422 can be shared between offset correction and Coriolis processing operations.

Referring to FIG. 4, the C2V amplifier 408 is a capacitance sensing circuit that converts the rotation-related charge stored on MEMS capacitors formed by MEMS structure 402 to an output voltage by pushing this charge from MEMS capacitors (not depicted) to feedback capacitors (e.g., feedback capacitors 410 and 412) of the C2V amplifier 408. The C2V amplifier 408 output common mode 450/452 is set by a periodic reset (e.g., at each period of the Coriolis signal, timed to begin at zero-crossing) that shorts the output of the C2V to its input (e.g., via switches 414 and 416).

In some instances, the signals output to the sense path (e.g., first sense path signal line 404 and second sense path signal line 406) may be provided in a round robin fashion from multiple MEMS structures 402, for example, by time multiplexing (not depicted in FIG. 4) the outputs of multiple MEMS structures 402. With round robin operations only a reset method of applying output common mode to input is feasible due to the short time that the reset signal is present. The timing of the reset signal and closing of switches 414 and 416 is typically aligned with the zero crossing of the Coriolis signal sinusoid that is output by the MEM structure 402.

When the reset switch is opened, the sampled MEMS Coriolis signal (e.g., including a signal at a drive frequency of the system, with a signal due to angular velocity modifying the amplitude of the Coriolis signal) is provided as an input to C2V amplifier 408 via the sense path (first sense path signal line 404 and second sense path signal line 406) is transferred to C2V feedback capacitors 410 and 412 and shows up as a sampled offset at C2V output 450/452. Since the MEMS Coriolis signal is nearly zero at that time, very little of the MEMS signal gets sampled during the release of the reset signal and very little of C2V output range is occupied by such offset. As described herein, the offset circuitry attempts to drive the remaining offset portion (e.g., based in part on remaining quadrature signal sampled at the end of the reset) towards zero, substantially removing all of the offset signal from the C2V output.

The outputs 450/452 from C2V amplifier 408 are first provided to integrator 420, which integrates the output signal to output a signal representative of the offset, for example by integrating the output signal at a drive frequency associated with the Coriolis and quadrature signals. The integrator may average the incoming signal over a gyroscope drive period with a reset of the integrator after each drive period. Averaging over the drive period and resetting nulls out gyroscope drive related tones, since an average of a sinusoid of the period of the sinusoid is zero. The resulting output thus generally corresponds to an average of the output signal, which generally corresponds to the offset portion of the C2V output. The integrated signal is output from integrator 420 to ADC 422 (e.g., a SAR DAC), which converts the integrated signal corresponding to the offset into a digital signal (e.g., a 13-bit digital signal) for further processing by digital stage 418.

In an embodiment, the digital stage 418 is implemented as a second-order Sigma-Delta modulator that drives the variable capacitor 432/434 values in the direction needed to minimize ADC output, which represents digitized C2V output offset. The uncancelled offset error (quantization noise) is spread over higher frequency spectrum, with any limit cycles eliminated by built in PRBS (pseudo random binary sequence) generator, that injects random noise into digital ADC 422 output. This results in zero C2V offset. Although particular filters, gain values, and combinations thereof are depicted as implementing this functionality at digital stage 418, a variety of filters, gain values, combinations thereof, and order of processing operations may be modified in certain embodiments in accordance with the present disclosure. For example, the order of the sigma-delta modulator can be increased or decreased and the update rate of the variable capacitors can increase or decrease. Appropriate gain and filter values, and digital processing operations, may be dependent upon the components of the particular processing circuitry of the MEMS sensor, such as the gain and configuration of the C2V amplifier 408 and related components (e.g., capacitors 410 and 412), the drive frequency of the MEMS structure 402, the number and resolution of available capacitance values for variable capacitors 432 and 434, and other related factors.

Within the exemplary digital stage 418 depicted in FIG. 4, the digital output (e.g., a 13-bit digital representation of the C2V offset portion) is provided in parallel to first filter 440, which in an embodiment is a non-delayed integrator with a complex transfer function of $z/(z-1)$. The output of the first filter 440 is provided to adder 444 and to second filter 441, which is in a signal path with first gain element 442 and adder 444. In an embodiment, second filter 441 symbolizes a unit delay and has a complex transfer function of $1/z$. The path of gain element 442 having a gain of $-K_{FF}$ is used to stabilize the system as described herein, for example, by changing the pole location of the overall transfer function of digital 418 to eliminate the any resonance peaks.

The outputs of first filter 440 and first gain element 442 are combined at adder 444, after which they are provided to second gain element 446, which applies a gain to scale the output appropriately to control the capacitors, which in the embodiment of FIG. 4, is a 1/16 gain that removes four bits of resolution from the digital signal being processed (e.g., resulting in 9 bits of resolution). The output of second gain element 446 is provided to third filter 448, which in the embodiment of FIG. 4, is a delayed integrator having a complex transfer function $1/(z-1)$.

A digital control signal (e.g., a 9-bit control signal) is output from digital stage 418 to variable capacitors 432 and 434. In an embodiment, each of the variable capacitors 432 and 434 may include an array of capacitors that are selectively switched into a circuit, resulting in combined capacitances that span a wide range of capacitances based on which capacitors are selected and how they are connected to other capacitors within the array of capacitors. The variable capacitors 432 and 434 are responsive to the digital input provided by the control signal output from digital stage 418. When driven by drive circuit 430 (e.g., a drive amplifier that translates capacitive change in the MEMS drive electrodes to an output voltage, resulting in a signal such as a sinusoid at the MEMS drive frequency and having a programmable amplitude), the variable capacitors 432 and 434 with values that are appropriately selected by digital stage 418, essentially apply a DC shift to the C2V amplifier 408 that removes the offset from the C2V output. In some embodiments, aspects of the drive signal (e.g., amplitude, frequency, phase) provided by drive circuitry 430 may also be modified based on control signals generated by digital stage 418.

Figure 5:
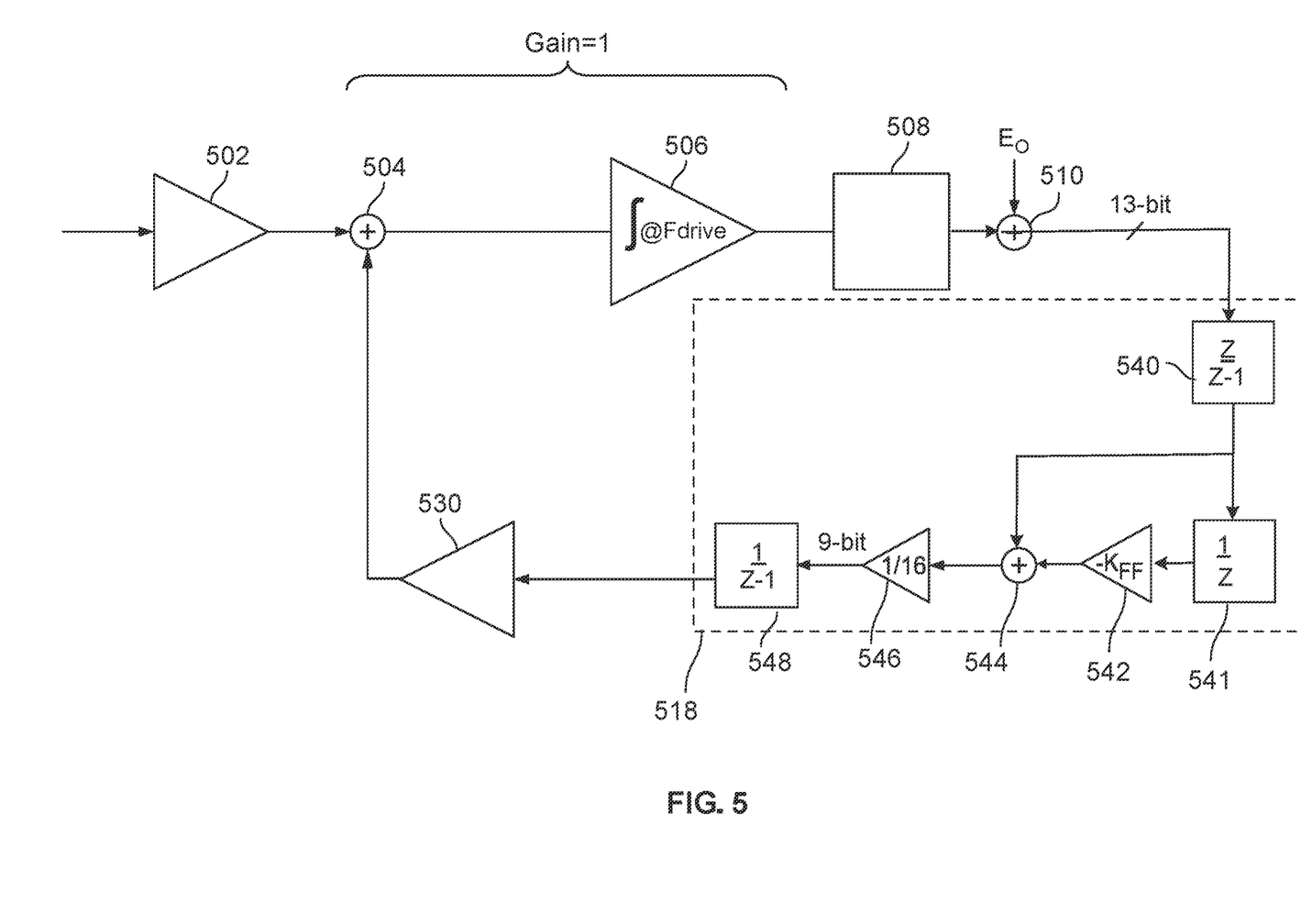
FIG. 5 depicts an exemplary symbolic representation of an exemplary MEMS sensor including offset cancellation in accordance with an embodiment of the present disclosure.

FIG. 5 depicts an exemplary symbolic representation of an exemplary MEMS sensor including offset cancellation in accordance with an embodiment of the present disclosure. Although FIG. 5 will be described in the context of a particular application and system components, it will be understood that the present disclosure may be utilized with a variety of sensor types, capacitive sensing systems, processing circuitry configurations, and digital stage operations. In the exemplary embodiment, each element has a gain contribution to the system. Quantifying and balancing these gains allow the modeling and selection of components and parameters, such as component types, component value, applied gain of components, and digital processing parameters.

In the embodiment of FIG. 5, the symbolic representations generally correspond to components or combinations of components of FIG. 4. Gain element 502 generally combines the calculated gain of the MEMS structure 402, C2V 408, and associated components (e.g., feedback capacitors 410 and 412), and may be dependent on changes to the input signal from the MEMS structure 402, which should generally change with an applied angular velocity (e.g., in degrees per second). Adder 504 represents the combining of the contribution of the offset compensation circuit, for example, based on an output of the gain element 530, which has a gain based on the potential values of the variable capacitors 432 and 434 and the characteristics of the drive signal provided by drive circuitry 430, as scaled and modified by the output of the digital stage 518 (e.g., corresponding to digital stage 418).

The adder 504 outputs the combined signal from gain elements 502 and 530 to integrator 506, which corresponds to integrator 420 in FIG. 4. The adder 504 and integrator 506 perform operations of combining and averaging signals, but do not apply any additional gain, and thus have a combined gain of 1 as depicted in FIG. 5. Quantization element 508 and adder 510 correspond to ADC 422, and correspond to a quantization gain (e.g., 4096/1V for a 13 bit SAR ADC) applied at quantization element 508 and the addition of added noise $E_0$ (e.g., a pseudo random binary sequence generator), that injects random noise into digital ADC output as symbolized by adder 510. The output from adder 510 (e.g., corresponding to the digitized offset with injected random noise) is provided to digital stage 518, which corresponds to and has digital processing steps corresponding to digital stage 418.

Figure 6:
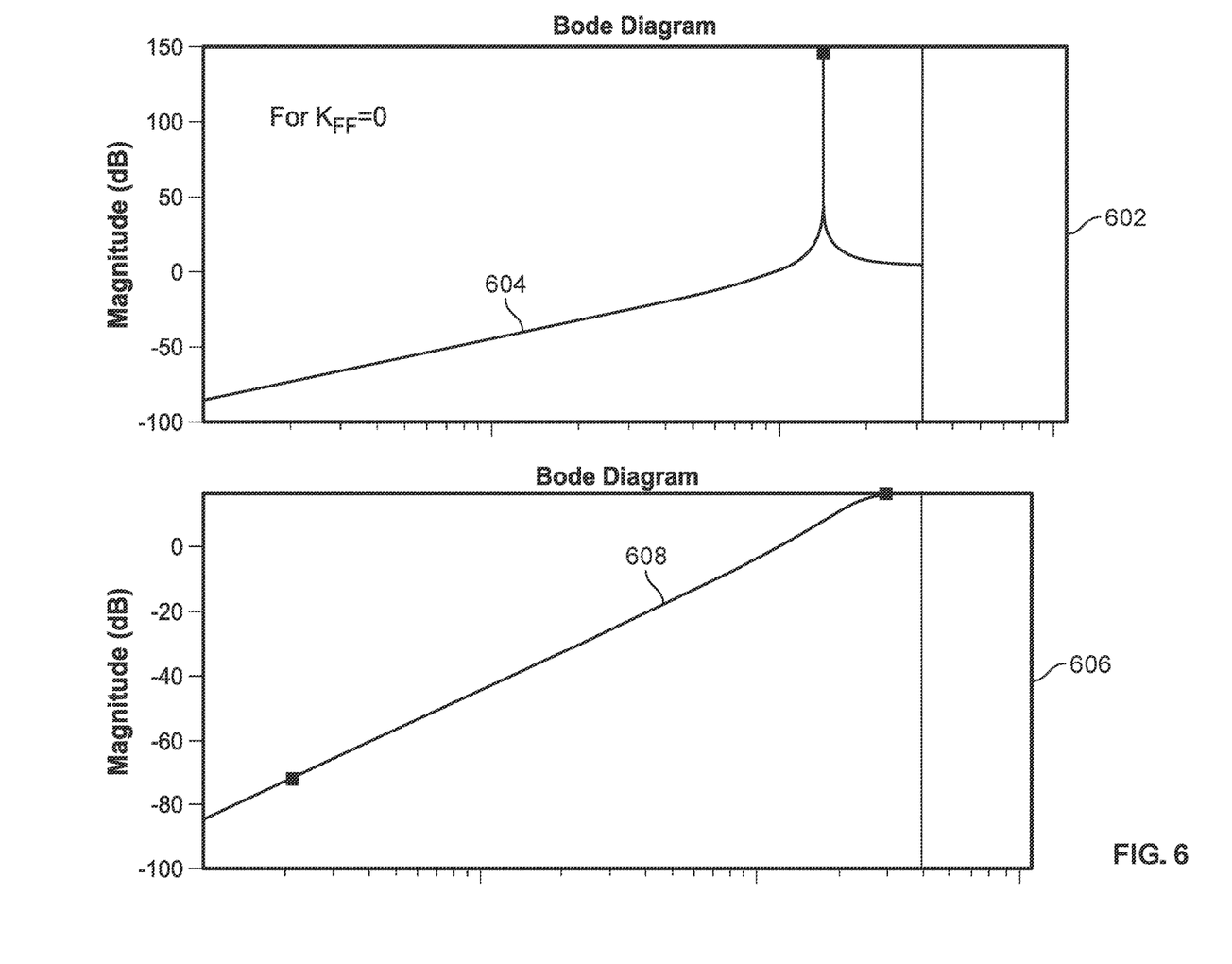
FIG. 6 depicts exemplary Bode diagrams of an output response to offset cancellation in a MEMS sensor in accordance with an embodiment of the present disclosure.

FIG. 6 depicts exemplary Bode diagrams of an output response to offset cancellation in a MEMS sensor in accordance with an embodiment of the present disclosure. Although FIG. 6 will be described in the context of a particular application and system components, it will be understood that diagrams such as those presented in FIG. 6 will be dependent on the particular configuration and components utilized for capacitive sensing and offset cancellation. A first Bode diagram 602 corresponds to an uncompensated system, e.g., with KrF (e.g., corresponding to first digital gain element 442/542 of FIGS. 4-5) set to zero (e.g., removed from the digital stage 418/518 of FIGS. 4-5). As is depicted by first signal transfer function 604, although the signal transfer function is a high-pass, a large resonance peak (e.g., a large response voltage) occurs at a frequency (e.g., corresponding to a frequency of a sensed angular velocity in degrees per second) within a range of interest of the sensor. When an appropriate compensation term with $K_{FF}$ (e.g., corresponding to first digital gain element 442/542 of FIGS. 4-5) is included in the system, a compensated system does not experience a resonance peak within the range of interest, and the signal transfer function is a high-pass.

Figure 7:
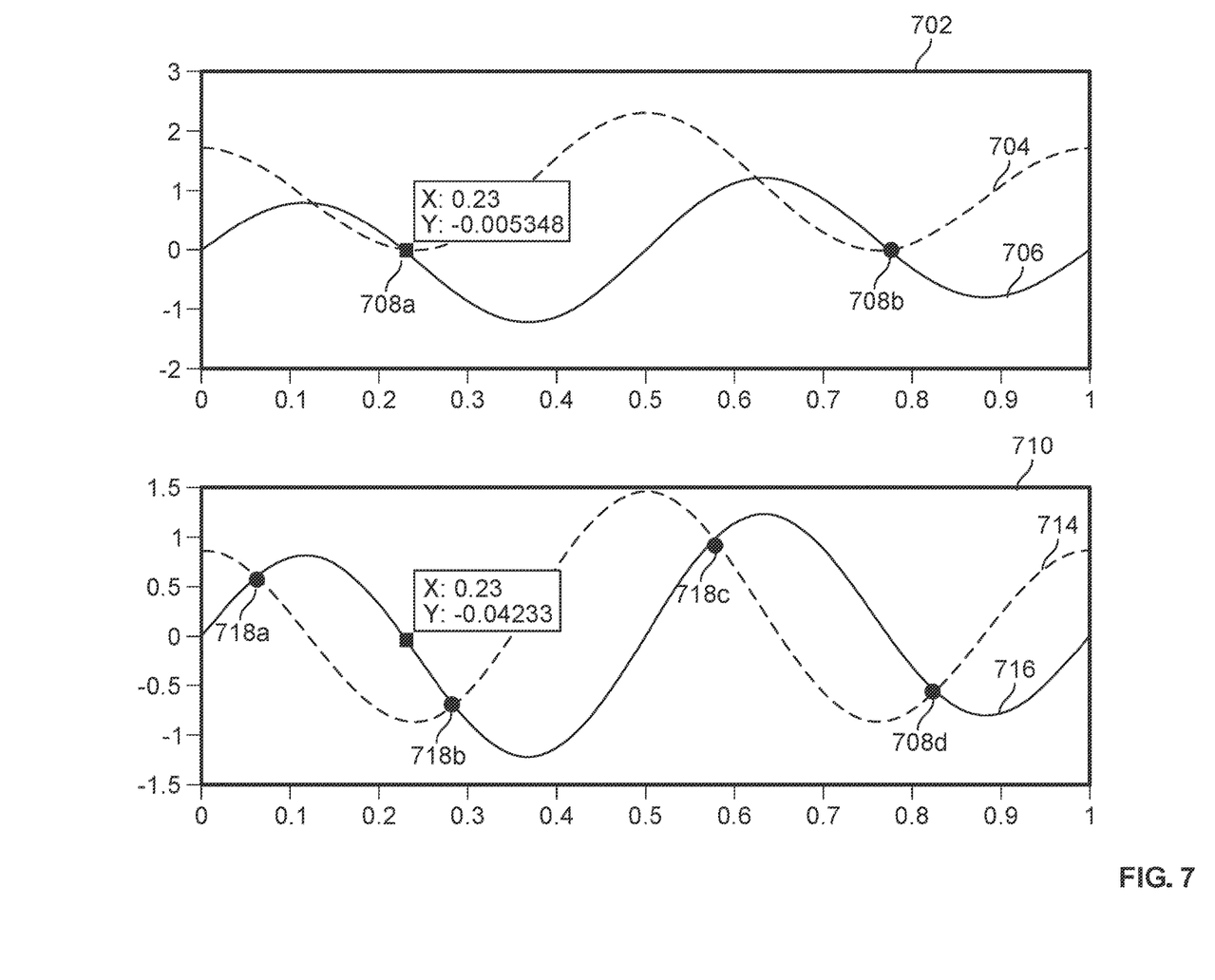
FIG. 7 depicts exemplary plots of real and complex frequency responses of the system corresponding to different gain coefficient values, in accordance with an embodiment of the present disclosure.

FIG. 7 depicts exemplary plots of real and complex frequency responses of the system corresponding to different gain coefficient values, in accordance with an embodiment of the present disclosure. These are depicted and described in the context of the particular system and digital stage depicted in FIGS. 4-5 herein, but it will be understood that the gain coefficient selection described herein applies to other implementations, and can be identified by modeling the system, for example, as described herein.

The system depicted and described can be represented as follows:

$$K_{IN} * DPS_{IN} - V_{OUT} * \frac{Q}{16} * \frac{K_{FB}}{(Z-1)^2} * (Z - K_{FF}) = V_{OUT} \quad (1)$$

where:
$K_{IN}$=gain of MEMS sensor and C2V (e.g., as corresponding to 502)
$DPS_{IN}$=angular velocity sensed by MEMS sensor (e.g., at 502)
$V_{OUT}$=output voltage from integrator 506
Q=quantization gain of ADC 508
$K_{FB}$=feedback path gain 530
$K_{FF}$=gain of stabilization gain element 542
Shifting the $V_{OUT}$ terms to the same side of the equation and simplifying terms results in the following:

$$K_{IN} * DPS_{IN} = V_{OUT}\left(1 + Q/16 * \frac{K_{FB} * (Z - K_{FF})}{(Z-1)^2}\right) \quad (2)$$

The equation can be further simplified with the complex terms as follows:

$$K_{IN} * DPS_{IN} = V_{OUT}\left(\frac{Z^2 - 2Z + 1 + \frac{K_{FB}Q}{16} * Z - K_{FB}\frac{Q}{16}K_{FF}}{(Z-1)^2}\right) \quad (3)$$

$$K_{IN} * DPS_{IN} = V_{OUT}\left(\frac{Z^2 + Z\left(\frac{K_{FB}Q}{16} - 2\right) + 1 - K_{FB}\frac{Q}{16}K_{FF}}{(Z-1)^2}\right) \quad (4)$$

Based on the above, the response of the system ($V_{OUT}$) to a particular sensed angular velocity ($DPS_{IN}$) can be represented as follows:

$$\frac{V_{OUT}}{DPS_{IN}} = K_{IN}\frac{(Z-1)^2}{Z^2 + Z\left(\frac{K_{FB}Q}{16} - 2\right) + 1 - \frac{K_{FB}Q}{16} * K_{FF}} \quad (5)$$

In the above equation (5), the real and complex portions of the denominator depend in part on the values of $K_{FF}$ and $K_{FB}$. Plot 702 illustrates an example where $K_{FF}$ is set to zero, with the amplitude of the real portion 704 and complex portion 706 varying based on the x-axis frequency of angular velocity in units of 2Π*x (rad). As is depicted in plot 702, there are multiple frequencies 708a and 708b (e.g., at approximately 0.23 and 0.88) where both the real portion 704 and the complex portion 708 are zero or approximately zero simultaneously. As a result, the denominator term of equation (5) above approaches zero, resulting in a resonance peak at these frequencies, for example, as depicted in first signal transfer function 604.

Plot 710 depicts an appropriately selected stabilization gain such as $K_{FF}$=0.5 for the system depicted herein, although it will be understood that different stabilization gains will be selected based on particular sensor characteristics, analog circuitry, and digital processing implementations. As depicted in FIG. 7, real portion 714 and complex portion of 716 only intersect at amplitudes (e.g., 718a, 718b, and 718c) that are significantly greater or less than zero, meaning that the overall denominator of equation (5) does not approach zero at any time, for example, as depicted in second signal transfer function 606.

Figure 8:
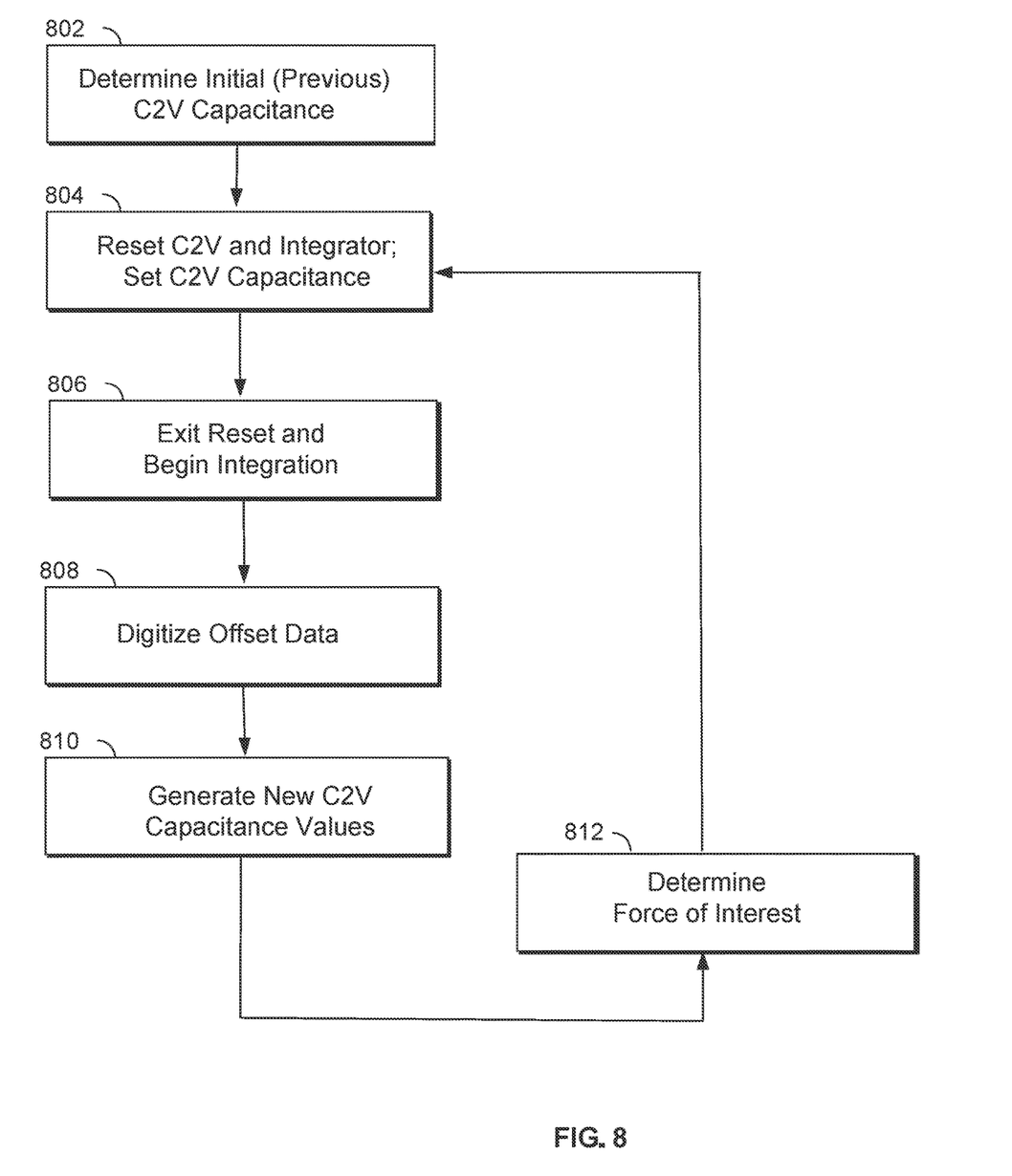
FIG. 8 depicts exemplary steps of offset cancellation in a MEMS sensor in accordance with an embodiment of the present disclosure.

FIG. 8 depicts exemplary steps of offset cancellation in a MEMS sensor in accordance with an embodiment of the present disclosure. Although particular steps are depicted in a certain order for FIG. 8, steps may be removed, modified, or substituted, and additional steps may be added in certain embodiments, and in some embodiments, the order of certain steps may be modified. Although the steps of FIG. 8 may be described in the context of certain of the implementations discussed herein, it will be understood that these steps may be applied to all of the implementations disclosed in the present disclosure.

Processing starts at step 802, where an initial C2V capacitance to be applied to the system (e.g., via variable capacitors as described herein) may be determined, for example, by accessing previously determined variable capacitor values from memory for a particular sensor, or in round-robin operation, a particular axis being switched into the sense path. In some instances, variable capacitance values may have previously been set for the sensor or axis as described herein, such that conditions may be similar to the present operating conditions and the initial variable capacitor values may substantially remove much of the offset. Once the initial variable capacitor values are determined, processing may continue to step 804.

At step 804 the output of a C2V amplifier is reset and the integrator is also reset. In an example of a round-robin system for processing MEMS sensor outputs, multiple MEMS structures or portions of structures (e.g., a multi-axis sensing MEMS gyroscope) may sense different forces of interest (e.g., a 3-axis gyroscope may include signal outputs corresponding to a sensed angular velocity about each of an x-axis, y-axis, and z-axis). The signals may be processed by shared processing circuitry, for example, by multiplexing the sensed capacitance signals (e.g., time multiplexing) such that each signal is provided to the processing circuitry at appropriate times, and with appropriate sampling periods, to process each of the received signals. In this manner, the area occupied by processing circuitry and overall power consumption of the MEMS sensor may be reduced. Although a reset (e.g., shorting the input of the C2V amplifier to the output of the C2V amplifier) may also be implemented for other purposes (e.g., for generating a common-mode output), in an embodiment of round robin processing the reset may temporarily zero the output of the C2V amplifier and the integrator, for example, at a time when the periodic Coriolis signal is at a zero-crossing. The C2V amplifier and integrator may then be reset periodically during sensing, for example, at each period of the signal being sensed. The reset may persist for an adequate time to zero the output of the C2V amplifier and integrator, after which the reset is removed (e.g., by removing the short between the C2V amplifier input and output). After the reset is removed, processing may continue to step 806.

At step 806, after the reset is removed, the signal corresponding to the force of interest may be received. Although components may be included in the system (e.g., trimming capacitors at a C2V input) to remove signal components that contribute to a C2V output signal offset (e.g., by reducing a quadrature portion of the received signal), there may nonetheless be a significant signal component received by the C2V input even when the reset is timed to correspond to a zero-crossing of the signal corresponding to the force of interest (e.g., the Coriolis signal). As an example, in a gyroscope the initial trimming may not be precise, the characteristics of the gyroscope may drift over time, the characteristics of the gyroscope may change after trimming (e.g., due to stress imparted on the MEMS structure when the sensor is assembled with other components of the end product), or the operating environment (e.g., temperature) may impact the gyroscope response. When the initial received signal has a significant signal component (e.g., a quadrature signal) at the time of the release of the reset, that signal component will appear as an offset at the C2V output, with the signal of interest riding on the offset portion of the output signal. The offset may occupy a substantial portion of the output range of the C2V amplifier, limiting the ability to apply additional gain to the signal of interest to increase sensing resolution. The output of the C2V amplifier is then integrated. Integrating the output averages the C2V output signal at an integer multiple of gyroscope oscillation period (e.g., one), reducing the contribution of demodulated non-DC products of the force of interest (e.g., various integer multiples of drive harmonic multiplied by Coriolis signal) and other periodic signals (e.g., quadrature signal) to the C2V output signal, resulting in a signal that corresponds to the offset portion of the C2V output signal. When the C2V signal is initially output after a reset, the amplitude of the offset portion of the C2V output signal may be significant compared to the amplitude of the signal corresponding to the force of interest (e.g., Coriolis signal). As described herein and in the following steps, the analog and digital stages of the present disclosure modify values of variable capacitors located at an input to the C2V amplifier in a manner that reduces the contribution of the offset to the C2V output signal. Accordingly, the output portion of the signal that is output by the integrator is driven towards zero in a short period of time between resets (e.g., repeated loops of the steps of FIG. 8) and the output of the integrator is similarly driven towards zero. Once the C2V output signal is integrated, processing may continue to step 808.

At step 808, the output of the integrator from step 806 may be digitized to prepare the output for processing by the digital stage. The integrator output is digitized with adequate precision (e.g., bits) for the digital stage to provide appropriate processing, for example, to avoid output swings caused by rough digital transitions. Further, because the C2V output signal has been integrated, the digital stage will be able to process the offset portion of the C2V output signal without needing to compensate for signal changes due to periodic portions of the C2V output signal (e.g., Coriolis signal, quadrature signal, etc.). In an exemplary embodiment the integrated C2V output signal may be digitized by an ADC such as a SAR ADC, and an exemplary resolution of the ADC may be 13 bits. In some instances, the ADC or subsequent circuitry may inject random noise into the digital output, for example, with a built in PRBS (pseudo random binary sequence) generator. The uncancelled offset error (quantization noise) is spread over higher frequency spectrum, with any limit cycles eliminated. Once the integrated C2V output signal has been digitized, processing may continue to step 810.

At step 810, the digital stage may process the received digital signal to generate a control signal in a manner that reduces the offset portion of the C2V output signal. The digital stage includes a variety of gain elements, filters, and signal paths, and in an embodiment, implements a second-order Sigma-Delta modulator. A compensation gain term in the initial signal path (e.g., gain $K_{FF}$) stabilizes the system (e.g., removes resonance peaks within a frequency range of interest) and is subtracted from the output of an initial first-order filter. A gain is applied to scale the output appropriately to control the capacitors (e.g., a gain of 1/16 to remove the least significant 4 bits of resolution from the 13-bit signal). An additional filter (e.g., integrator) processes this 9-bit signal to generate the control signal, which in turn controls the operation of variable capacitors connected at the sense signal inputs to the C2V amplifier. The digital stage sets the values of the control signals to drive the offset portion of the C2V output signal towards zero. The variable capacitance will then be applied at an appropriate time, such as the next reset cycle. Example variable capacitors may each be capable of receiving a digital input that controls the operation of the variable capacitors, such as by modifying a configuration of an array of capacitors in a manner that corresponds to the control signal (e.g., switching particular capacitors of the array of capacitors into the active circuit and/or modifying signal paths between capacitors within the array of capacitors). Although the variable capacitors are described herein as having the same available capacitance values and responding to the same control signal, in some embodiments that variable capacitors may have different base capacitances, more than one control signal may be provided, and the variable capacitors may respond differently to a provided control signal. In some embodiments, the variable capacitors may have an initial value, for example, that is set along with the reset signal, and that corresponds to a fixed base value or previously determined capacitance values for the particular signal being sensed (e.g., previously determined variable capacitance values for a particular sense axis in a round robin scheme). Once the digital processing is completed and the control signal has been provided, processing may continue to step 812.

At step 812, processing may be performed to measure the force of interest. Once the offset portion of the C2V output is removed or substantially reduced, the gain of the C2V amplifier is effectively applied to only the remaining signal portions, including the signal of interest (e.g., a Coriolis signal modulated by a drive frequency) and other signals (e.g., any remaining quadrature signal). In some embodiments, this measurement may be performed only after the offset portion has been reduced or removed, such as by implementing a set delay time or based on a measurement (e.g., at the integrator or ADC output) of the offset signal portion. The measurement may be performed based on the output signal of the C2V converter having the offset portion removed. Processing may be performed to remove undesired characteristics of the output signal such as the quadrature signal. In some embodiments, certain components may be shared with the offset cancellation circuitry, for example, by routing the signal corresponding to the force of interest (e.g., with any remaining quadrature signal reduced or removed) to the ADC (e.g., SAR ADC) after the offset compensation has been performed. Once the signal of interest has been measured, processing may continue to return to step 804 for the next reset and measurement cycle.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical system (MEMS) sensor, comprising:

a MEMS structure including one or more MEMS components that move in response to force of interest, wherein the movement causes a change of a sense capacitance of the MEMS sensor;

a capacitance-to-voltage (C2V) converter configured to receive a capacitance signal that corresponds to the sense capacitance;

a sense path coupled to the MEMS structure and the C2V converter to provide the capacitance signal to the C2V converter;

one or more variable capacitors coupled to the sense path; and processing circuitry coupled to an output of the C2V converter and the one or more variable capacitors, wherein the processing circuitry is configured to receive an output signal from the output of the C2V converter, identify an offset signal portion of the output signal, and generate a variable capacitor control signal to modify a capacitance of the one or more variable capacitors to remove the offset signal portion from the output signal, wherein the MEMS structure comprises a MEMS gyroscope and is configured to sense a respective angular velocity about each of a plurality of sense axes to generate a plurality of capacitance signals, further comprising a multiplexer located within the sense path, wherein the multiplexer selectively provides one of the capacitance signals to the C2V converter via the sense path, and wherein the one or more variable capacitors is coupled to the sense path between the multiplexer and the C2V converter.

2. The MEMS sensor of claim 1, further comprising a reset circuit coupled to the C2V converter, wherein the reset circuit is configured to reset the C2V converter when the multiplexer switches to selectively provide one of the capacitance signals to the C2V converter.

3. The MEMS sensor of claim 1, wherein the sense path comprises a plurality of signal lines and wherein a first signal line provides a first capacitance signal corresponding to a first capacitance of the MEMS structure and a second signal line provides a second capacitance signal corresponding to a second capacitance of the MEMS structure.

4. The MEMS sensor of claim 3, wherein the one or more variable capacitors comprise two variable capacitors, and wherein a first variable capacitor is connected to the first signal line and a second variable capacitor is connected to the second signal line.

5. The MEMS sensor of claim 4, wherein the first capacitance signal and the second capacitance signal correspond to differential capacitors.

6. The MEMS sensor of claim 4, wherein the first variable capacitor is connected on one side to the first signal line and on another side to a drive signal and wherein the second variable capacitor is connected on a first side to the second signal line and a second side to the drive signal.

7. The MEMS sensor of claim 1, wherein the processing circuitry comprises an analog stage coupled to receive the output signal from the output of the C2V converter and a digital stage coupled to receive an analog stage output signal, and wherein the digital stage generates the variable capacitor control signal based on the analog stage output signal.

8. The MEMS sensor of claim 7, wherein the analog stage comprises an integrator and an analog-to-digital converter (ADC), and wherein the integrator is electrically coupled between the output of the C2V converter and the ADC, and wherein the digital stage is coupled between an ADC output and the one or more variable capacitors.

9. The MEMS sensor of claim 8, wherein the digital stage comprises a sigma-delta modulator.

10. The MEMS sensor of claim 8, wherein a frequency of the integrator corresponds to a drive frequency of the MEMS structure.

11. The MEMS sensor of claim 8, wherein the ADC comprises a successive-approximation register (SAR) ADC.

12. The MEMS sensor of claim 8, wherein the digital stage comprises a second-order sigma-delta modulator.

13. The MEMS sensor of claim 8, wherein the offset signal portion corresponds to a DC average of the output signal in an absence of the force of interest, and wherein the variable capacitor control signal modifies the one or more variable capacitors to drive the DC average to zero.

14. The MEMS sensor of claim 13, wherein the variable capacitor control signal comprises a digital control signal, and wherein the digital control signal modifies the one or more variable capacitors.

15. The MEMS sensor of claim 14, wherein each of the one or more variable capacitors comprises an array of selectable capacitors.

16. The MEMS sensor of claim 1, further comprising one or more fixed capacitors coupled to the sense path, wherein the one or more fixed capacitors remove a portion of the offset signal portion of the output signal.

17. A microelectromechanical system (MEMS) sensor, comprising:
a MEMS structure including one or more MEMS components that move in response to force of interest, wherein the movement causes a change of a sense capacitance of the MEMS sensor;
a capacitance-to-voltage (C2V) converter configured to receive a capacitance signal that corresponds to the sense capacitance;
a sense path coupled to the MEMS structure and the C2V converter to provide the capacitance signal to the C2V converter;
one or more variable capacitors coupled to the sense path; and
processing circuitry coupled to an output of the C2V converter and the one or more variable capacitors, wherein the processing circuitry is configured to receive an output signal from the output of the C2V converter, identify an offset signal portion of the output signal, and generate a variable capacitor control signal to modify a capacitance of the one or more variable capacitors to remove the offset signal portion from the output, wherein the processing circuitry comprises an analog stage coupled to receive the output signal from the output of the C2V converter and a digital stage coupled to receive an analog stage output signal, wherein the digital stage generates the variable capacitor control signal based on the analog stage output signal, and wherein the analog stage comprises an integrator and an analog-to-digital converter (ADC), and wherein the integrator is electrically coupled between the output of the C2V converter and the ADC, and wherein the digital stage is coupled between an ADC output and the one or more variable capacitors.

18. The MEMS sensor of claim 17, wherein the digital stage comprises a sigma-delta modulator.

19. The MEMS sensor of claim 17, wherein a frequency of the integrator corresponds to a drive frequency of the MEMS structure.

20. The MEMS sensor of claim 17, wherein the ADC comprises a successive-approximation register (SAR) ADC.

21. The MEMS sensor of claim 17, wherein the digital stage comprises a second-order sigma-delta modulator.

22. The MEMS sensor of claim 17, wherein the offset signal portion corresponds to a DC average of the output signal in an absence of the force of interest, and wherein the variable capacitor control signal modifies the one or more variable capacitors to drive the DC average to zero.

23. The MEMS sensor of claim 22, wherein the variable capacitor control signal comprises a digital control signal, and wherein the digital control signal modifies the one or more variable capacitors.

24. The MEMS sensor of claim 23, wherein each of the one or more variable capacitors comprises an array of selectable capacitors.

25. The MEMS sensor of claim 17, wherein the MEMS structure comprises a MEMS gyroscope.

26. The MEMS sensor of claim 25, wherein the MEMS structure is configured to sense a respective angular velocity about each of a plurality of sense axes to generate a plurality of capacitance signals, further comprising a multiplexer located within the sense path, wherein the multiplexer selectively provides one of the capacitance signals to the C2V converter via the sense path, and wherein the one or more variable capacitors is coupled to the sense path between the multiplexer and the C2V converter.

27. The MEMS sensor of claim 26, further comprising a reset circuit coupled to the C2V converter, wherein the reset circuit is configured to reset the C2V converter when the multiplexer switches to selectively provide one of the capacitance signals to the C2V converter.

28. The MEMS sensor of claim 17, wherein the sense path comprises a plurality of signal lines and wherein a first signal line provides a first capacitance signal corresponding to a first capacitance of the MEMS structure and a second signal line provides a second capacitance signal corresponding to a second capacitance of the MEMS structure.

29. The MEMS sensor of claim 28, wherein the one or more variable capacitors comprise two variable capacitors, and wherein a first variable capacitor is connected to the first signal line and a second variable capacitor is connected to the second signal line.

30. The MEMS sensor of claim 29, wherein the first capacitance signal and the second capacitance signal correspond to differential capacitors.

31. The MEMS sensor of claim 29, wherein the first variable capacitor is connected on one side to the first signal line and on another side to a drive signal and wherein the second variable capacitor is connected on a first side to the second signal line and a second side to the drive signal.

32. The MEMS sensor of claim 17, wherein the processing circuitry comprises an analog stage coupled to receive the output signal from the output of the C2V converter and a digital stage coupled to receive an analog stage output signal, and wherein the digital stage generates the variable capacitor control signal based on the analog stage output signal.

33. The MEMS sensor of claim 17, further comprising one or more fixed capacitors coupled to the sense path, wherein the one or more fixed capacitors remove a portion of the offset signal portion of the output signal.

34. A method for removing offset from an output of a MEMS capacitance-to-voltage (C2V) converter, comprising:
receiving, at an input of the C2V converter, a capacitance signal that corresponds to a movement of a component of a microelectromechanical system (MEMS) structure due to a force of interest from a sense path coupled to the MEMS structure and the C2V converter;

outputting, from the C2V converter, an output signal, wherein the output signal includes an offset signal portion of the output signal;

generating, by processing circuitry, a variable capacitor control signal to remove the offset signal portion from the output signal; and providing, from the processing circuitry to one or more variable capacitors coupled to the sense path, the variable capacitor control signal, wherein the one or more variable capacitors are coupled to the C2V converter to modify the received capacitance signal, wherein the MEMS structure comprises a MEMS gyroscope and is configured to sense a respective angular velocity about each of a plurality of sense axes to generate a plurality of capacitance signals, further comprising a multiplexer located within the sense path, wherein the multiplexer selectively provides one of the capacitance signals to the C2V converter via the sense path, and wherein the one or more variable capacitors is coupled to the sense path between the multiplexer and the C2V converter.

35. A method for removing a sampled offset from a sensed signal of a microelectromechanical system (MEMS) gyroscope, comprising:

receiving, at an input of a C2V converter, a capacitance signal that corresponds to a movement of a component of a MEMS structure;

outputting, from the C2V converter, an output signal;

integrating the output signal;

digitizing the integrated output signal, wherein the integrated and digitized output signal corresponds to an offset portion of the output signal;

generating, by digital processing circuitry, a variable capacitor control signal to remove the offset portion of the output signal; and providing, from the digital processing circuitry to one or more variable capacitors, the variable capacitor control signal, wherein the one or more variable capacitors are coupled to the C2V converter to modify the received capacitance signal, wherein the processing circuitry comprises an analog stage coupled to receive the output signal from the output of the C2V converter and a digital stage coupled to receive an analog stage output signal, wherein the digital stage generates the variable capacitor control signal based on the analog stage output signal, and wherein the analog stage comprises an integrator and an analog-to-digital converter (ADC), and wherein the integrator is electrically coupled between the output of the C2V converter and the ADC, and wherein the digital stage is coupled between an ADC output and the one or more variable capacitors.

\* \* \* \* \*